US006204139B1

(12) United States Patent
Liu et al.

(10) Patent No.: US 6,204,139 B1
(45) Date of Patent: Mar. 20, 2001

(54) METHOD FOR SWITCHING THE PROPERTIES OF PEROVSKITE MATERIALS USED IN THIN FILM RESISTORS

(75) Inventors: Shangqing Liu; Naijuan Wu; Alex Ignatiev, all of Houston, TX (US)

(73) Assignee: University of Houston, Houston, TX (US)

( * ) Notice: Subject to any disclaimer, the term of this patent is extended or adjusted under 35 U.S.C. 154(b) by 0 days.

(21) Appl. No.: 09/139,994

(22) Filed: Aug. 25, 1998

(51) Int. Cl.⁷ .................................................. H01L 21/20
(52) U.S. Cl. ............................................................ 438/385
(58) Field of Search ................................. 438/3, 48, 57, 438/54, 240, 381, 384, 385; 257/295, 296; 427/58

(56) References Cited

U.S. PATENT DOCUMENTS

| 5,097,443 | 3/1992 | Kaneko et al. . |
| 5,372,859 | * 12/1994 | Thakoor ................................ 427/551 |
| 5,418,389 | 5/1995 | Watanabe . |
| 5,792,569 | 8/1998 | Zanhong et al. . |

OTHER PUBLICATIONS

Neil Mathur, "Not Just a Load of Bolometetrs," News and Views, Nature/vol. 390, pp. 229 & 231 (Nov. 20, 1997).
S. Jin, et al., "Thousandfold Change in Resistivity in Magnetresistive La–Ca–Mn–O Films," Science vol. 264, pp. 413–415 (Apr. 15, 1994).
K. Miyano, et al., "Photoinduced Insulator–to–Metal Transition in a Perovskite Manganite," Physical Review Letters, vol. 78, No. 22, pp. 4257–4260 (Jun. 2, 1997).
V. Klryukhin, et al., "An X–ray–Induced Insulator–metal Transition In a Magnetoresistive Manganite," Letters to Nature, vol. 386, pp. 813–815 (Apr. 24, 1997).
A. Asamistu, et al., "Current Switching of Resistive States in Magnetoresistive Manganites," Letters to Nature, vol. 388, pp. 50–52 (Jul. 3, 1997).
H. Lin, et al., "Transient Behavior and Memory Effect of $aPbZrxTi1-xO3/YBa2Cu3O7-x$ Three–Terminal Device," American Institute of Physics Lett. 65 (8), pp. 953–955 (Aug. 22, 1994).
Nai Juan Wu, et al., "Heterostructures of $Pb(ZrxTi1-x)O3$ and $YBa2Cu3O7-x$ on MgO Substrate Prepared by Pulsed Laser Ablation," Jpn. J. Appl. Phys vol. 32, Part 1, No. 11A, pp. 5019–5023 (Nov. 1993).
S. K. Singh, et al., "Growth, Transport, and Magnetic Properties of $Pr0.67Ca0.33MnO3$ Thin Films," American Institute of Physics, App. Phys. Lett., vol. 69, No. 2, pp. 263–265 (Jul. 8, 1996).

* cited by examiner

Primary Examiner—Charles Bowers
Assistant Examiner—Keith Christianson
(74) Attorney, Agent, or Firm—Baker Botts L.L.P.

(57) ABSTRACT

A method for switching properties of perovskite thin film materials, including the colossal magnetoresitive (CMR) and high temperature superconducting (HTSC) materials, is provided. Short electrical pulses are applied to the materials in thin films to change both reversibly and non-reversibly the electrical, thermal, mechanical and magnetic properties of the material. Reversible resistance changes of over a factor of 10 are induced in CMR materials at room temperature and in zero external magnetic field by electrical pulsing. Applications of the method and materials to form memory devices, resistors in electronic circuits which can be varied in resistance and other applications are disclosed.

13 Claims, 5 Drawing Sheets

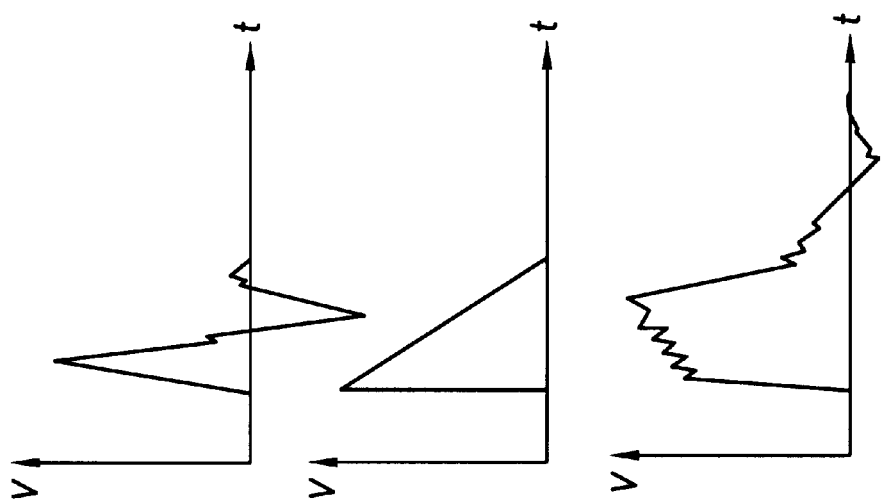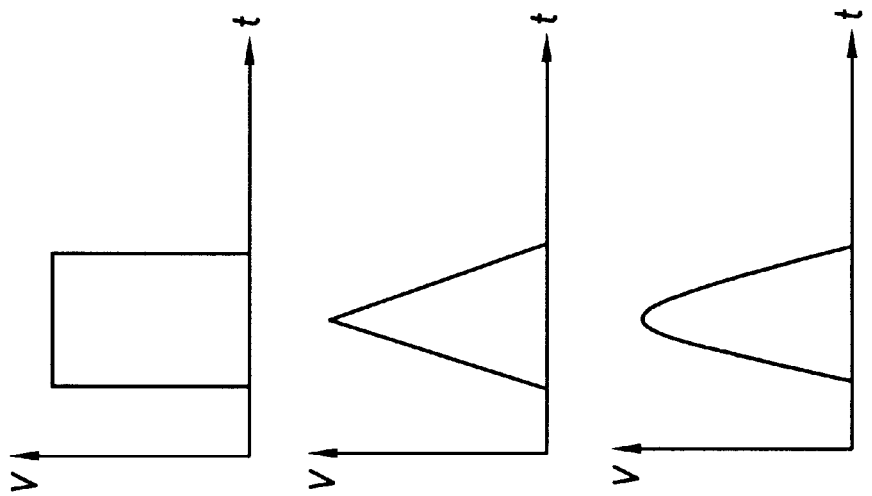

US 6,204,139 B1

METHOD FOR SWITCHING THE PROPERTIES OF PEROVSKITE MATERIALS USED IN THIN FILM RESISTORS

BACKGROUND OF THE INVENTION

1. Field of the Invention

This invention relates to thin film materials having a perovskite structure. More particularly, a method of using an electrical pulse to modify or switch the characteristics of materials such as colossal magnetoresistive and high temperature superconducting materials is provided and applications of the method are provided.

2. Description of Related Art

The materials having a perovskite structure, among them colossal magnetoresistance (CMR) materials and high temperature superconductivity (HTSC) materials, are important in many fields. The common and the most substantial characteristic of the CMR and HTSC materials is that their electrical resistance can be changed significantly by external influence, such as temperature, magnetic field or electric field. The CMR materials have wide applications. They can provide a cheap and practical means of sensing magnetic fields ("Colossal Magnetoresistance not just a Load of Bolometers," N. Mathur, *Nature*, vol. 390, pp. 229–231, 1997), and lead to dramatic improvements in the data density and reading speed of magnetic recording systems ("Thousandfold Change in Resistivity in Magnetoresistive La—Ca—Mn—O Films," S. Jin, et al, *Science*, vol. 264, pp. 413–415, 1994). They can also become a new material for thermal or infrared detectors, and a new material for photo and X-ray detection ("Photoinduced Insulator-to-Metal Transition in a Perovskite Manganite," K. Miyano, et al, *Physical Review Letters*, vol. 78, pp. 4257–4260, 1997; "An X-ray-induced Insulator-metal Transition in a Magnetoresistive Manganite," V. Klyukhin, et al, *Nature*, vol. 386, pp. 313–315, 1997). Moreover, a static electric field can trigger the collapse of the insulating charge-ordered state of CMR materials to a metallic ferromagnetic state, and so provide a route for fabricating micrometer- or nanometer-scale electromagnets ("Current Switching of Resistive States in Magnetoresistive Manganites," A. Asamitsu, et al, *Nature*, vol. 388, pp. 50–52, 1997). The main use of the recently discovered HTSC materials is, of course, as the superconductors, and their conductivity can be affected by applied electric current or magnetic field ("Transient Behavior and Memory Effect of a $PbZr_xTi_{1-x}O_3/YBa_2Cu_3O_{7-x}$ Three-terminal Device," H. Lin, et al, *Appl. Physics Letters*, vol. 65, pp. 953, 1994). However, they also have some other uses, for example as the conductive layer in the epitaxial multilayer structures used at room temperature ("Heterostructures of $Pb(Zr_xTi_{1-x})O_3$ and $YBa_2Cu_3O_{7-\delta}$ on MgO Substrate Prepared by Pulsed Laser Ablation, N. J. Wu, et al, *Jpn. J. Appl. Phys.*, vol. 32, pp. 5019–5023, 1993).

Although it has been known that temperature, magnetic field, or static electric field can change the properties of the CMR and HTSC materials, it has been observed that these stimuli do not switch the states or permanently modify the properties of these materials. Therefore, when the stimulus vanishes, the changed material's state or property will return back to its original value. For example, the resistance of CMR materials changes with large applied magnetic fields. When the magnetic field increases, the resistance of a CMR material decreases, and when the magnetic field decreases and goes back to zero, the resistance of the CMR material will increase and return to its original value. Only at very low temperatures does a relatively large resistive lag occur in these materials, which is somewhat like the magnetic lag for ferromagnets.

Another limitation of previously observed changes in the properties of CMR materials as a result of a stimulus is that they significantly respond to changes in magnetic field only under large magnetic fields (several Tesla), or changes in static electric field only at very low temperatures. Therefore, it is not convenient in many cases to use magnetic or static electric fields to change the properties of the CMR materials. As many of the current applications of CMR and HTSC materials are based on using thin films, there is great interest in modifying thin film properties of these materials.

What is needed is a method which can be used to repeatedly switch the state or modify the properties of CMR, HTSC and films of other perovskite-like materials such that a modified property will continue after the stimulus to switch is removed. The method should work conveniently, repeatedly and at room temperature.

SUMMARY OF THE INVENTION

A method for modifying the properties of thin film materials having a perovskite structure, especially for the CMR and HTSC materials, by applying one or more short electrical pulses to a thin film or bulk material is provided. The electric field strength or electric current density from the pulse is sufficient to switch the physical state of the materials so as to modify the properties of the material. The pulse is of low enough energy so as not to destroy the material. The electrical pulse may have square, saw-toothed, triangular, sine, oscillating or other waveforms and may be of positive or negative polarity. Multiple pulses may be applied to the material to produce incremental changes in properties of the material. Applications of the method include: resistance-based read only or random access memory devices with high data density and reading speed, resistors that can be changed in resistance value by electrical pulsing for use in electronic circuits, and sensors that can be changed in sensitivity by pulsing.

BRIEF DESCRIPTION OF THE DRAWINGS

FIGS. 3(a), 3(b), 3(c), 3(d), 3(e) and 3(f) show the waveforms of the applied electrical pulses according to the invention.

DESCRIPTION OF THE PREFERRED EMBODIMENTS

Figure 1:
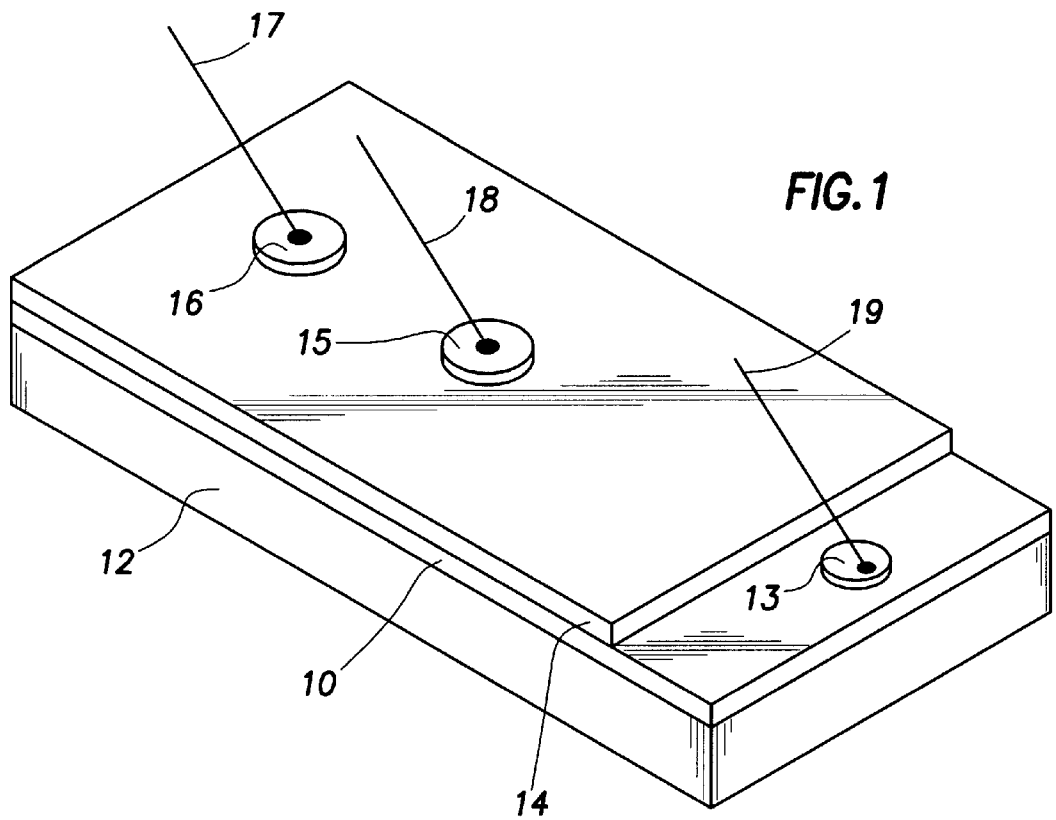
FIG. 1 is a schematic diagram of a CMR film in a bilayer structure and the electrical connections required to modify film properties according to the invention.

Referring to FIG. 1, a diagram of a bi-layer device using a colossal magnetoresistive (CMR) thin film material is shown. Conductive layer 10 is used as the bottom electrode layer on substrate 12. Bottom electrode contact 13 is joined to layer 10. Bottom layer 10 is then partially covered with CMR thin film 14. Top electrode contacts 15 and 16 are made to thin film 14. Contacts 13, 15 and 16 are connected to wires 17, 18 and 19, respectively. Conductive layer 10 may be crystalline or polycrystalline, but its resistivity should be less than that of CMR layer 14.

A typical bi-layer device of this invention is made of a conductive oxide or other conductive material bottom layer, e.g. $YBa_2Cu_3O_7$ (YBCO) or Pt, of thickness in the range from about 5 nm to about 5000 nm, for bottom electrode layer 10. This layer 10 is deposited on an oxide or other atomically ordered or polycrystalline substrate 12, e.g. (100) $LaAlO_3$, Si, TiN, etc. Active layer top layer 14 is made of a perovskite material, such as a CMR or HTSC material, e.g. $Pr_{0.7}Ca_{0.3}MnO_3$ (PCMO), of thickness in the range from about 5 nm to about 5000 nm. Bottom contact 13 and two top contacts 15 and 16 may be made of Ag, Au, Pt or other metal or a conducting oxide, and may be deposited by any variety of techniques onto the active CMR, HTSC or other perovskite layer.

By applying an electrical pulse between wires 18 and 19, an electric field and current will be created across CMR film 14. Because the electrical resistivity of the film is much larger than that of the bottom layer, the current will primarily flow through the CMR film vertically. Therefore, if the CMR film is thin and the areas of the electrode contacts are small, a strong electric field strength and a strong electric current density will be produced in the CMR film in the vicinity of electrode contact 15 even if the peak voltage of the pulse is not high. This field or current changes the resistive properties of the film.

The characteristics of the CMR materials are affected significantly by their internal charge distribution (see the article "Current Switching of Resistive States in Magnetoresistive Manganites," referenced above). A sufficiently high electric field strength or/and electric current density can change their charge distribution, and possibly their microstructures, and thus switch their states or modify their properties such as resistivity, sensitivity to temperature, magnetic field, electric field, and mechanical pressure. However, high electric field strength or/and high electric current can damage the materials and destroy their crystal or microscopic structure.

We have discovered that an electric field high enough to change the properties of perovskite materials can be used by applying the electrical field in short pulses. Further, we have found that the changed properties will remain in the altered state after the pulse. Further, if pulse energy is sufficiently small the material is not damaged.

Prior methods that result in changes in material characteristics similar to the modification described here can only be used during the preparation of the material, not to modify the properties or to switch the state of a CMR material repeatedly after the material has been made. For example, a defect structure or a heterostructure of the CMR material can respond to small changes in magnetic field, as reported in the article "Colossal Magnetoresistance not just a Load of Bolometers," referenced above, but this defect structure has to be injected into the material during its preparation.

Electrical pulses may be applied to the perovskite material in layer 14 through wires 17 or 18 and 19. Voltages from about 5 volts to about 150 volts can be used dependent on thickness of the perovskite and structure and composition of the electrode. When the peak voltage of the applied pulses increases above a threshold value, the resistance of material in layer 14 changes, even in zero magnetic field and at room temperature. The threshold voltage depends on active film thickness and film composition, shape of the contact pads and the distance between the pads. Typically, a voltage greater than 5 volts will yield an electrical field of ~$10^5$ V/cm in the perovskite material of layer 14. After applying each pulse to the sample, the resistance increases or decreases depending on the following parameters: the pulse peak voltage, the pulse waveform, the direction of electric field and the history of the change of the resistance. The changed resistance value is stable to another static or pulsed electric field as long as the voltage of that succeeding field is lower than the threshold value for the specific material/device.

Figure 2A:
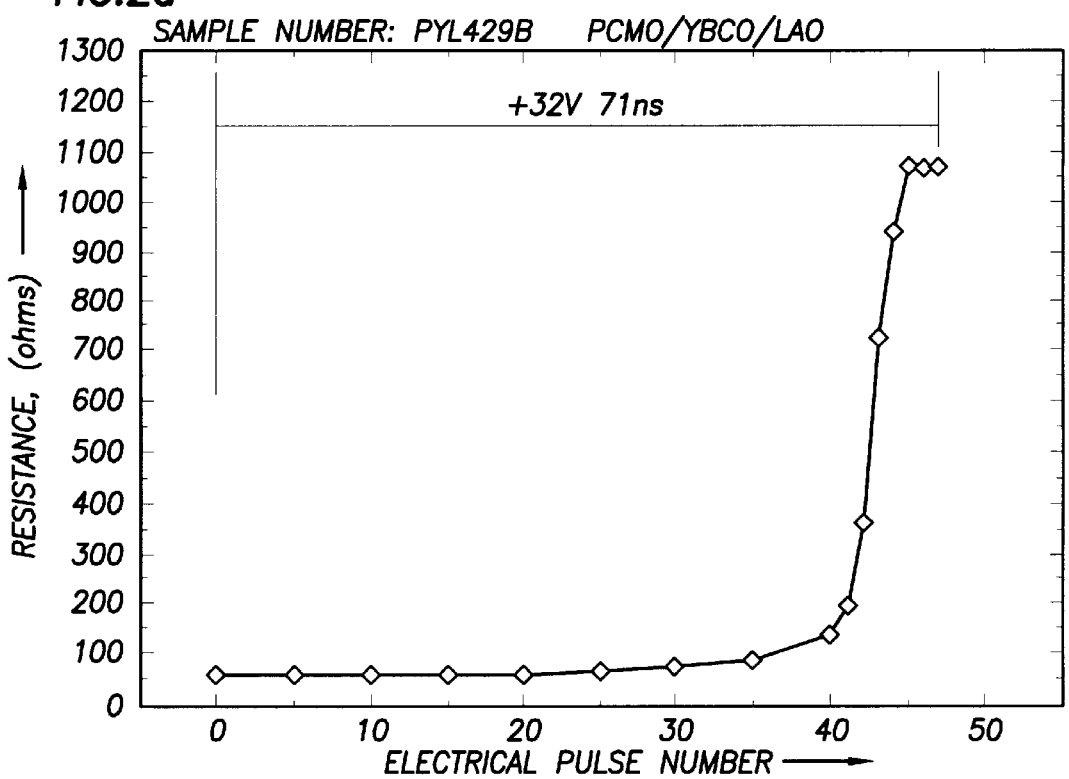
FIG. 2a shows the resistance versus electrical pulse number for a bilayer CMR film grown a metallic substrate and exposed to 47 electrical pulses having an amplitude of 32 volts.

A curve of resistance versus number of unipolar electrical pulses in zero magnetic field and at room temperature is shown in FIG. 2a. The device is composed of a $Pr_{0.7}Ca_{0.3}MnO_3$ layer of about 600 nm thickness deposited by pulsed laser deposition (PLD) on top of a YBCO bottom electrode layer of about 1000 nm also deposited by PLD on top of a $LaAlO_3$ (100) single crystal substrate. The top electrode on the PCMO is a sputtered silver dot, as is the electrical contact pad on the YBCO bottom layer. Silver wires are attached to these pads for electrical stimulation. Such oxide films can be made by a number of deposition techniques including pulsed laser deposition, rf-sputtering, e-beam evaporation, thermal evaporation, metalorganic deposition, sol gel deposition, and metal organic chemical vapor deposition. The pulsed laser deposition method used here incorporates a target composed of a sintered or crystalline oxide of the composition similar to that of the final oxide film ($Pr_{0.7}Ca_{0.3}MnO_3$) which is irradiated by a pulsed and focused laser beam usually with wavelength in the near ultra-violet region as from an excimer laser (wavelengths of 157 nm, 193 nm, 248 nm, 308 nm, and 351 ) and at a beam energy of $\geq$ approximately 200 mJ. The target is housed in a vacuum chamber and is typically rotated such that the laser beam continuously hits a different point on the target. The laser beam impact on the target causes a plume of target material to be ejected from the target surface. A substrate is mounted approximately 1 to 4 cm in front of the target such that it intercepts the plume of materials and as a result a film of materials is deposited on the substrate. The substrate is held at an elevated temperature (nominally from 250° C. to about 900° C.) and in an oxidizing environment (nominally $O_2$ at from a few 10's milliTorr to a few Torr) during the deposition process. Deposition times vary from a few minutes to several tens or hundreds of minutes for oxide films of from 10 nm to 1000 nm thickness. The resistance increased with increasing number of pulses. The pulses had a square waveform, such as shown in FIG. 3(a), a peak voltage of +31V and a duration of about 71 ns. Electrical pulse-induced changes in the resistance of more than a factor of 10 were observed. Resistance increases were small until about 40 pulses had been applied, and then resistance increased rapidly. Experiments showed that other pulse shapes can be used, such as those shown in FIGS. 3(c) and 3(e). Since there are small inter-electrode capacitances, the waveform of the pulses was distorted upon application to the contacts, so the pulse from a square wave generator, such as shown in FIG. 3(a), appeared as shown in FIG. 3(b) upon application to the contacts. With the configuration of the test apparatus, a typical pulse peak voltage of about 5V or greater was needed to see the resistance changes in the material. Pulse durations of from about 1 ns to more than 100 $\mu$s can be used to initiate the changes in properties.

Figure 2B:
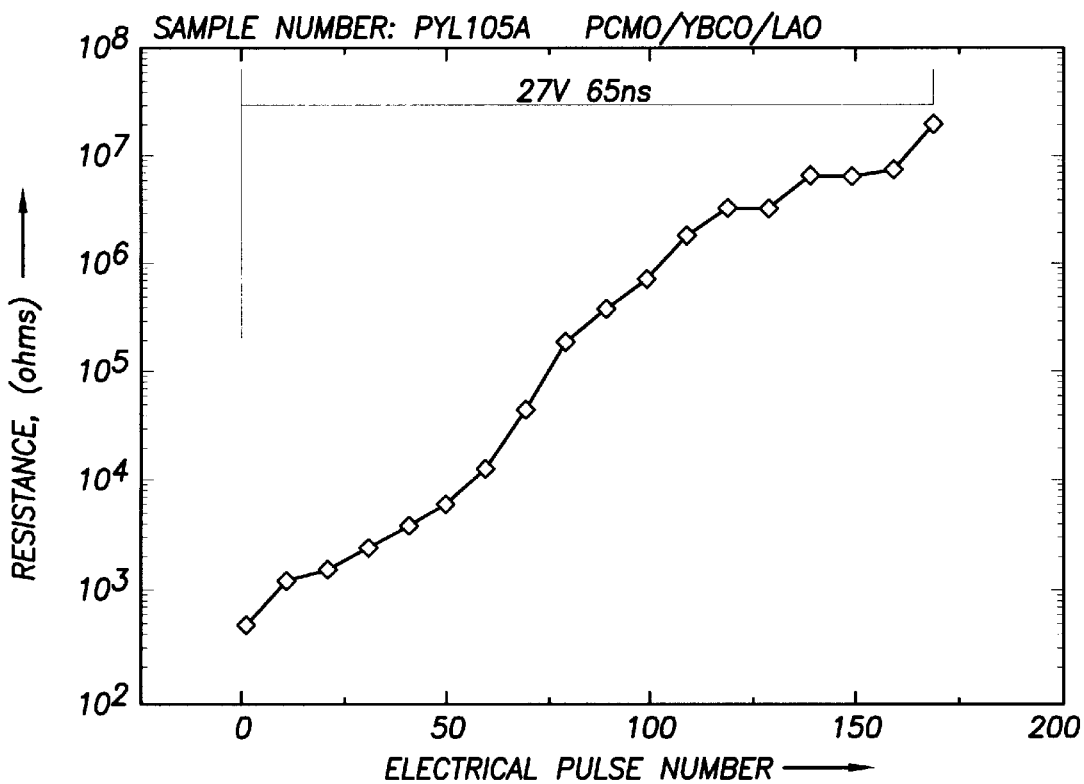
FIG. 2b shows the resistance versus electrical pulse number for a CMR film grown on a conducting oxide substrate and exposed to 168 electrical pulses having an amplitude of 27 volts.

Under conditions of a conducting oxide bottom electrode, the resistivity changes measured for the device can become extremely large as shown in FIG. 2b. This device is composed of a $Pr_{0.7}Ca_{0.3}MnO_3$ layer of about 550 nm thickness deposited by pulsed laser deposition (PLD) on top of a YBCO bottom electrode layer of about 500 nm also deposited by PLD on top of a $LaAlO_3$ (100) single crystal substrate. Electrical connections are similar to those of the sample in FIG. 2a. The large resistivity change exhibited in FIG. 2b is driven by both the change of the CMR layer and changes in the electrode/CMR layer interfaces, and is generally not fully reversible.

Applied electrical pulses may have square, triangular, saw-toothed, sine or other waveforms shown in FIGS. 3(a), 3(c) and 3(e), with the response at the wires as shown in FIGS. 3(b), 3(d) and 3(f). The pulses can be of any waveform provided that the pulses can create sufficiently high electric field strength or/and electric current density in the material to modify its state and the peak height and duration are small enough, that is, the pulse energy is small enough, so that the material will not be destroyed.

Figure 4A:
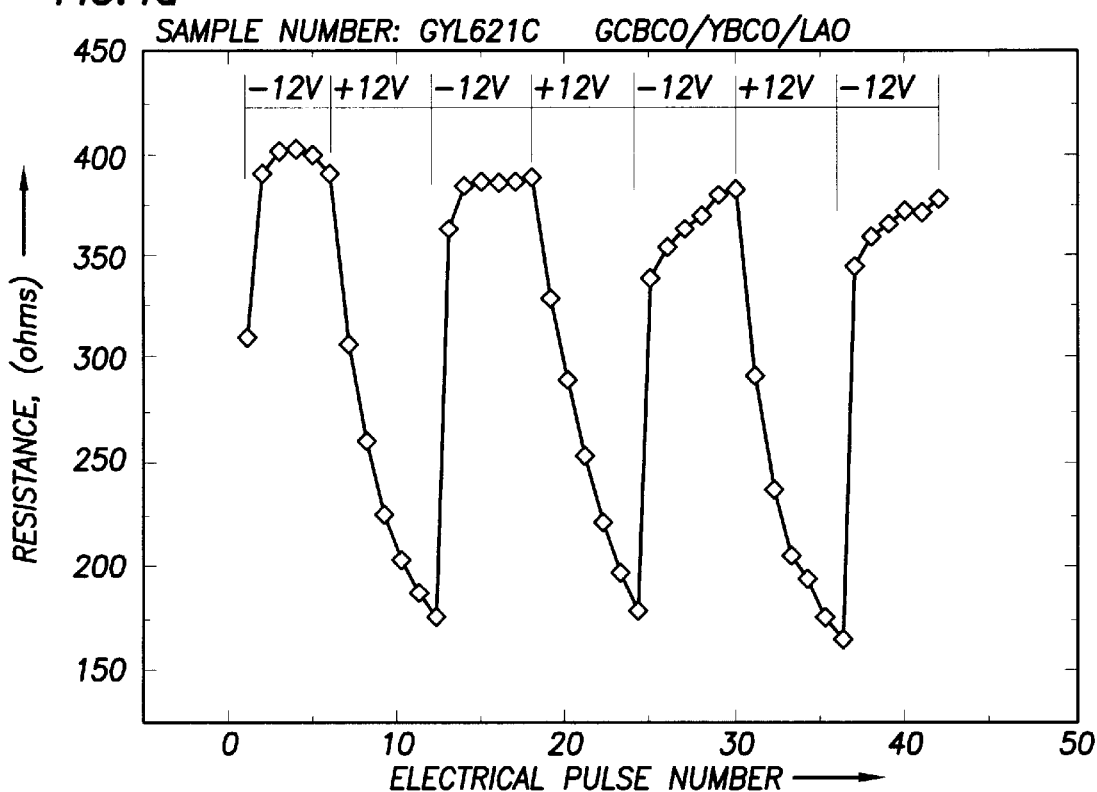
FIG. 4a shows switching in the resistance versus electrical pulse number curve for a bilayer CMR film exposed to both positive and negative electrical pulses.

Pulsing the bilayer device of FIG. 1 with pulses of different polarity showed a reversible switching effect. Referring to FIG. 4a, the graph shows that the resistance of a 400 nm thick $Gd_{0.7}Ca_{0.3}BaCo_2O_{5+\delta}$ based device with bottom YBCO electrode of thickness 850 nm and electrical contacts as for the device of FIG. 2a, increases from 175 ohms to a saturation value of 400 ohms after about five to seven pulses of −12 volts. Upon reversing the polarity of the pulses to +12 volts, the resistance dropped back to the initial starting value, 175 ohms. Upon application of pulses of the original polarity, resistance then increased again to 400 ohms. This behavior was shown to be repeatable on reversing pulse polarity.

Figure 4B:
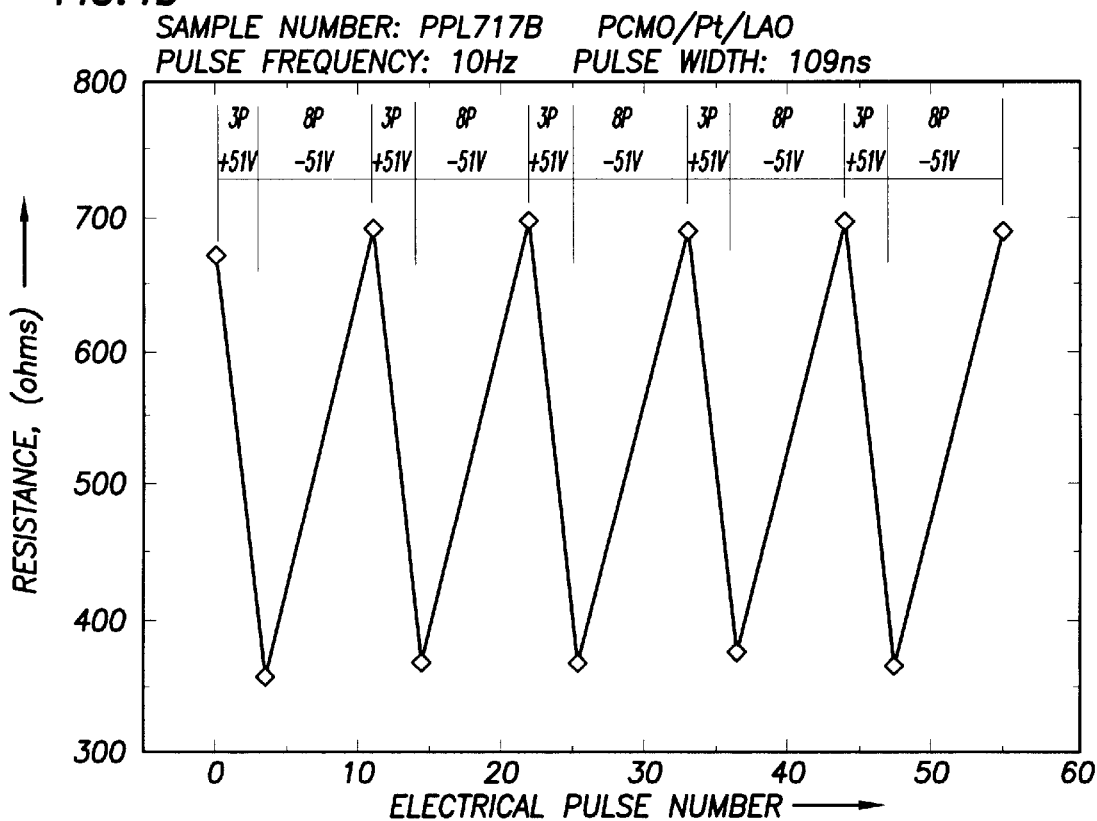
FIG. 4b shows switching in the resistance changes of a CMR bilayer sample exposed to a series of pulses before measurement of resistance.

If a series of pulses is used between measurements, less pulses are required of the "+" type to switch the material than the "−" type, where "+" indicates a positive voltage pulse applied to the bottom electrode of the device. A series of pulses can switch the material smoothly from low to high resistance in a very regular manner, as shown in FIG. 4b. The device in FIG. 4b consists of a PCMO film 750 nm thickness deposited on a Pt film of 120 nm thickness on $LaAlO_3$ with electrical contracts as for the device of FIG. 2a. Three positive pulses of 51 volts and eight negative pulses of 51 volts were used to produce the regular pattern of FIG. 4b. The pulses were 109 ns in length are there were 10 pulses per second.

Figure 5:
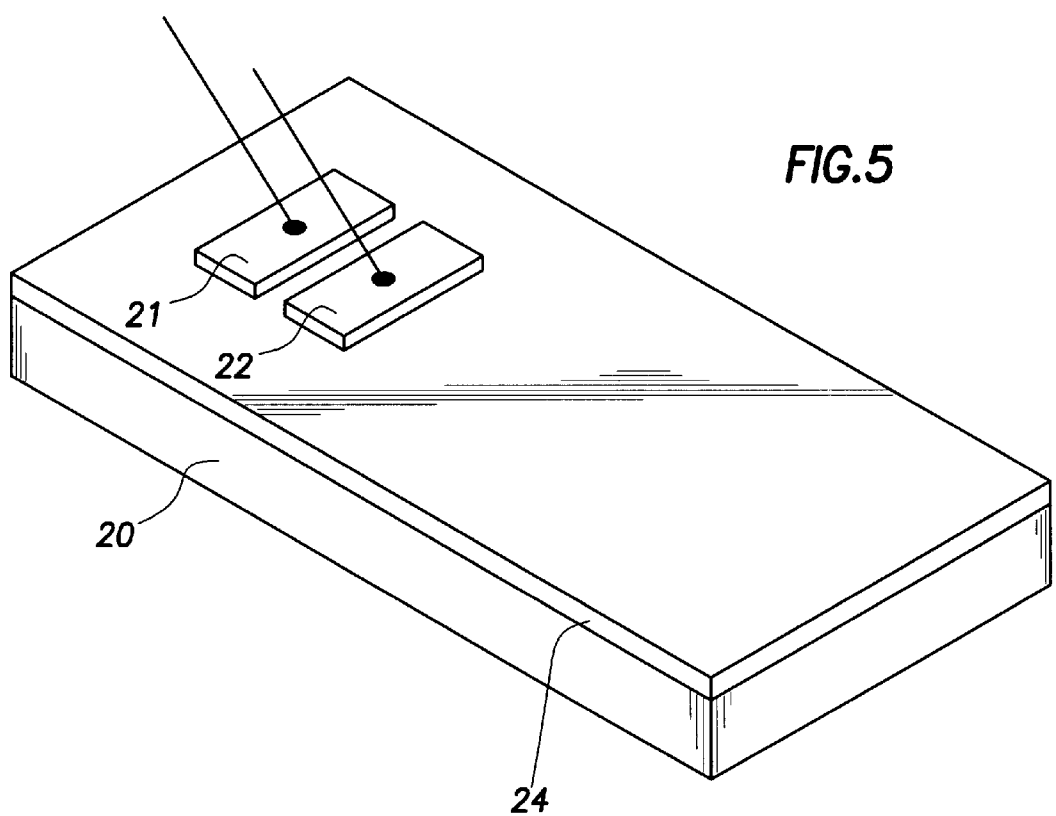
FIG. 5 is a schematic diagram of a CMR film in a single layer structure and the electrical connections required to modify film properties according to an embodiment of the invention.

A second embodiment of a device of this invention is shown in FIG. 5. A single layer 24 of a perovskite material, such as CMR or HTSC film (e.g., PCMO), of thickness in the range from about 5 nm to about 5000 nm is shown on an oxide or other atomically ordered or polycrystalline but insulating substrate 20, (e.g., (100) $LaAlO_3$). Two electrode contacts 21 and 22 are joined to the PCMO layer such that the distance between the electrode contacts is much less than the equivalent radii of the electrodes, in the range from about 0.1 micrometers to about 100 micrometers. Electrical pulses are applied to the film through the two electrode contacts to produce a resistance change, in zero magnetic field and at room temperature, with the number of pulses, as described above.

CMR materials and other materials having a perovskite structure, because their crystal types are similar to the CMR materials, can be changed in properties by application of short electrical pulses. Specifically, the resistance of a HTSC film of YBCO can be changed by short electrical pulses, and after the resistance of a YBCO film is changed by electrical pulses, the sensitivity of the film to temperature change and mechanical pressure will be changed. Therefore, the method of applying electrical pulses can be used to change the sensitivity of sensors based on perovskite materials. This is a new capability.

The inventors do not wish to be bound by any explanation of the changes in the properties of perovskite materials resulting from electrical pulses as described and claimed herein, but note that the behavior described herein cannot be explained by the traditional CMR resistance change effect under high magnetic fields, as set out, for example, in the paper "Growth, Transport, and Magnetic Properties of $Pr_{0.67}Ca_{0.33}MnO_3$ Thin Films," S. K. Singh, et al, *Appl. Phys. Lett.*, vol. 69, pp. 263–265, 1996. The pulsed electric field or pulsed current through the sample cannot create a high enough magnetic induction to change the resistance of the PCMO, and if it did, the resistance would decrease into a lower resistance state under this mechanism, and not to a higher resistance state as observed.

Figure 6:
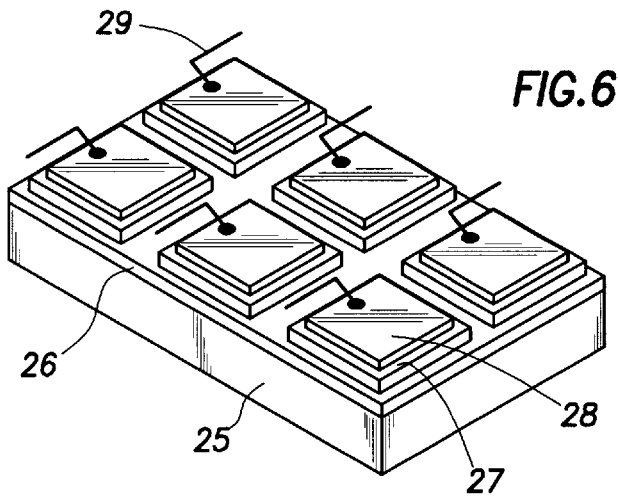
FIG. 6 is a schematic diagram of a section of a memory device consisting of CMR resistors in an array according to an embodiment of the invention.

Because the perovskite thin film materials, especially the CMR and HTSC materials are very useful in many fields and will become increasingly available, the state switching and properties modification method described above has many applications. The materials and methods may be used to make random access or read only memory devices with high data density and reading speed. Referring to FIG. 6, a section of a memory device having a CMR, HTSC or other perovskite resistor array is shown. Conductive layer 26, to be used as the bottom electrode, is formed on substrate 25. Over layer 26 a thin layer of CMR or HTSC material is grown and etched to form an electrical resistor array. Each resistor forms a memory unit. A top electrode array which shape matches the resistor array is then made on the resistors. The arrangement of connection wires 29 may adopt the schemes used in existing integrated circuits, which are well known in the art.

For writing information into this memory device, one may apply short electrical pulses to the chosen memory units through their top and bottom electrodes, thus making each of the chosen resistors have a special resistance value. According to that mentioned above, since these resistors are made of the CMR or HTSC film or other perovskite material having similar structure, the resistance of each resistor can be changed over an order of magnitude or more. Therefore, each memory unit can store much more information than those currently commonly existing.

For example, by applying electrical pulses to resistor 27 through its top electrode 28 and bottom electrode 26, the resistance between the top and bottom electrodes may be changed significantly, such as from 100 ohms to 1,000 ohms. If this range of resistance is divided into 100 divisions by linear or nonlinear intervals, an interval such as a linear interval 10 ohms wide can be set by a specific number of pulses having selected characteristics. When one takes the resistance value of 100 ohms to 110 ohms as number 1, the value of 110 ohms to 120 ohms as 2, and so on, the largest number which can be stored in this unit will be 100. It means that a such memory unit, which can have a size less than a transistor, will have a memory ability equivalent to that of a 0.1 kilobit memory element in the common memory devices.

This device will be non-volatile and radiation-hard. Furthermore, the read access time can be much shorter than for common memory, because the measurement of resistance of a resistor requires shorter time than to read the information stored in a 0.1 kilobit transistor memory element, and to measure a resistor with high resistance requires about the same time as that to measure one with low resistance. Such CMR or other perovskite non-volatile memory devices may be read-only memory, and as well as random access memory, because the information stored in each memory unit, that is, the resistance of each resistor may be reset to its original value by reversing the direction of a pulsed electric field.

Figure 7:
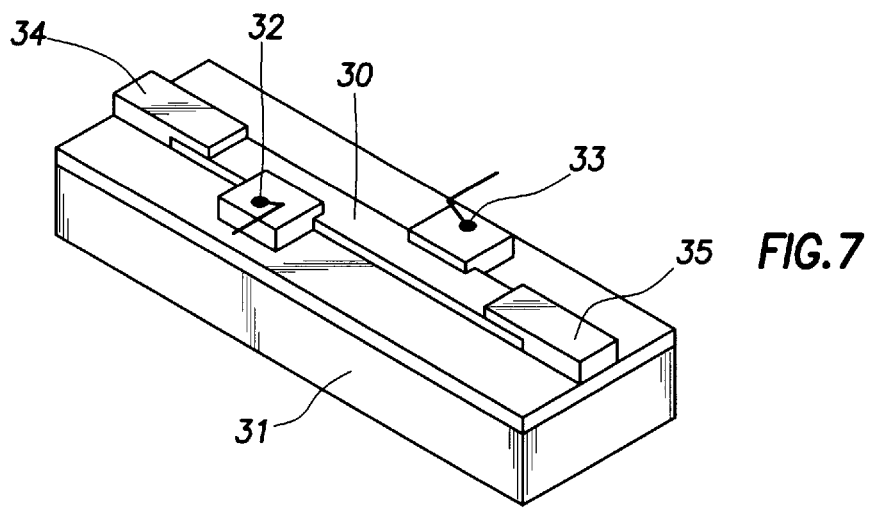
FIG. 7 is a schematic diagram of a variable resistor made of etched CMR film for circuit application according to an embodiment of the invention.

Another application of this properties-modification method is to make the film or bulk CMR material be a variable resistor that can be used in electronic circuits. FIG. 7 shows such a variable resistor in an integrated circuit, where CMR film resistor 30 is made by deposition and etching on substrate 31. Two electrodes, 32 and 33, which are on both sides of resistor 30, are used for changing its resistance. Wires 34 and 35 connect resistor 30 to the circuit. By applying electrical pulses to the resistor through the electrodes 32 and 33, the resistor's resistance may be changed. The electrical pulses may also be applied to the resistor through connecting wires 34 and 35; however, using the additional electrodes may avoid the influence to other elements in the circuit. This type of variable resistor has no moving parts or complex structures and thus can have smaller size, longer lifetime and the ability to change resistance over a large range.

Figure 8:
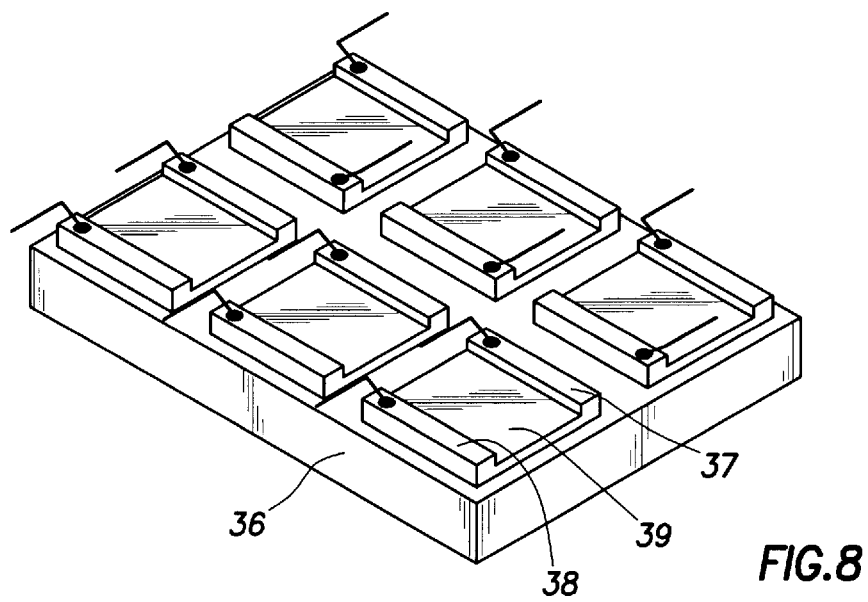
FIG. 8 is a schematic diagram of a section of an infrared detection array of the etched and modified CMR film as the sensors according to an embodiment of the invention.

Another application of this method is to modify the characteristics of the perovskite thin film materials, especially the CMR and HTSC materials, so as to increase or decrease their detection sensitivities when they are used as sensors for temperature, magnetic field, electric field, and mechanical pressure. An example of this is an infrared detector such as shown in FIG. 8. A CMR thin film 39 is made on substrate 36, then is etched into an array. Readout electronics can be imbedded between the CMR film and the substrate. The temperature sensitivity of the sensors can be changed by applying an individual pulse in the array, for example, using the electrodes 37 and 38 to apply pulses to sensor 39. If the sensor's thermometric sensitivity is increased, then it is possible to use such device to obtain infrared image information from a target at room temperature. When infrared radiation falls on a sensor, its resistance will change measurably even at room temperature. The additional readout electronics provides currents through each pair of electrodes. The intensity of the current passing through each sensor will change with incident infrared radiation. By using suitable readout electronics and image display, an infrared image of the target will be generated.

While particular preferred embodiments of the present invention have been described, it is not intended that these details should be regarded as limitations upon the present invention, except as and to the extent that they are included in the following claims.

What is claimed is:

1. A method for modifying a property of a perovskite material, comprising the steps of:

supplying the perovskite material in a thin film between a pair of electrodes, the film having an electrical resistance; and applying an electrical pulse to the pair of electrodes, the electrical pulse having a selected polarity, a selected width, a selected maximum value and a selected waveform, between the pair of electrodes, so as to create an electric field in the film greater than a threshold electric field value to change the property of the film, the pulse having a pulse energy less than a pulse energy required to damage the perovskite material.

2. The method of claim 1 wherein the perovskite material is selected from the group of materials consisting of colossal magnetoresistance materials.

3. The method of claim 1 wherein the perovskite material is selected from the group of materials consisting of high temperature superconductivity materials.

4. The method of claim 1 wherein the property modified in the film is the electrical resistance of the film.

5. The method of claim 1 wherein the property modified in the film is the temperature sensitivity of the material.

6. The method of claim 1 wherein the property modified in the film is the magnetic field dependence of the material.

7. The method of claim 1 wherein the selected waveform between the pair of electrodes results from a pulse generated, the pulse generated having a waveform selected from the group of waveforms consisting of square, sawtoothed, triangular and sine wave.

8. The method of claim 1 wherein the selected maximum value of the pulse is in the range from about 5 volts to about 150 volts.

9. The method of claim 1 wherein the selected duration of the pulse is in the range from about 1 nanosecond to about 100 microseconds.

10. The method of claim 1 further comprising the step of applying a selected number of pulses having a first selected polarity to the pair of electrodes, the selected number of pulses being greater than one.

11. The method of claim 10 wherein the selected number, selected width, selected maximum value, selected waveform and selected polarity of the pulses is selected to modify the physical property to a selected range of values.

12. The method of claim 11 wherein the polarity of the pulses is reversed during application of the selected number of pulses.

13. The method of claim 11 wherein the physical property is alternately modified to a second range of values and returned to a first range of values.

* * * * *